(12) United States Patent
Oka et al.

(10) Patent No.: US 7,422,928 B2
(45) Date of Patent: Sep. 9, 2008

(54) PROCESS FOR FABRICATING A MICRO-ELECTRO-MECHANICAL SYSTEM WITH MOVABLE COMPONENTS

(75) Inventors: Naomasa Oka, Osaka (JP); Hiroshi Harada, Hirakata (JP); Jun Ogihara, Tondabayashi (JP); Hiroshi Fukshima, Kadoma (JP); Hiroshi Noge, Kyoto (JP); Yuji Suzuki, Osaka (JP); Kiyohiko Kawano, Kadoma (JP); Takaaki Yoshihara, Osaka (JP); Masahiko Suzumura, Otsu (JP)

(73) Assignee: Matsushita Electric Works, Ltd., Osaka (JP)

( * ) Notice: Subject to any disclaimer, the term of this patent is extended or adjusted under 35 U.S.C. 154(b) by 363 days.

(21) Appl. No.: 10/572,554

(22) PCT Filed: Sep. 12, 2004

(86) PCT No.: PCT/JP2004/014142

§ 371 (c)(1),
(2), (4) Date: Mar. 17, 2006

(87) PCT Pub. No.: WO2005/028359

PCT Pub. Date: Mar. 31, 2005

(65) Prior Publication Data

US 2007/0128831 A1 Jun. 7, 2007

(30) Foreign Application Priority Data

Sep. 22, 2003 (JP) ............................. 2003-329845

(51) Int. Cl.
*H01L 21/00* (2006.01)
*H02N 1/00* (2006.01)

(52) U.S. Cl. ...................... 438/106; 438/107; 438/456; 359/223

(58) Field of Classification Search ................. 438/106, 438/107, 456; 359/223
See application file for complete search history.

(56) References Cited

FOREIGN PATENT DOCUMENTS

| EP | 1 203 748 A1 | 5/2002 |
|---|---|---|
| JP | 3-230779 | 10/1991 |

*Primary Examiner*—Evan Pert
(74) *Attorney, Agent, or Firm*—Edwards Angell Palmer & Dodge LLP

(57) ABSTRACT

A process for fabricating a micro-electro-mechanical system (MEMS) composed of fixed components fixedly supported on a lower substrate and movable components movably supported on the lower substrate. The process utilizes an upper substrate separate from the lower substrate. The upper substrate is selectively etched in its top layer to form therein a plurality of posts which project commonly from a bottom layer of the upper substrate. The posts include the fixed components to be fixed to the lower substrate and the movable components which are resiliently supported only to one or more of the fixed components to be movable relative to the fixed components. The lower substrate is formed in its top surface with at least one recess. The upper substrate is then bonded to the top of the lower substrate upside down in such a manner as to place the fixed components directly on the lower substrate and to place the movable components upwardly of the recess. Finally, the bottom layer of the upper substrate is removed to release the movable components from the bottom layer for floating the movable components above the recess and allowing them to move relative to the lower substrate, while keeping the fixed components fixed to the top of the lower substrate.

23 Claims, 12 Drawing Sheets

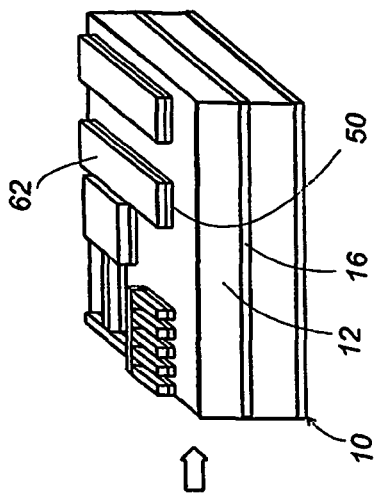
FIG. 3A  FIG. 3B  FIG. 3C  FIG. 3D
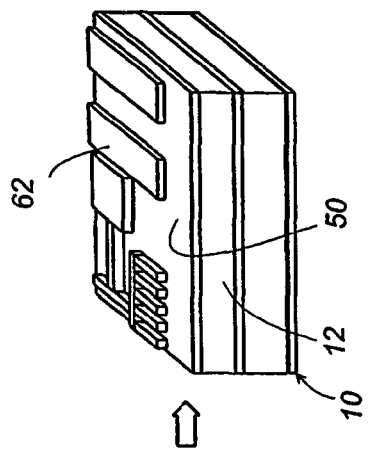
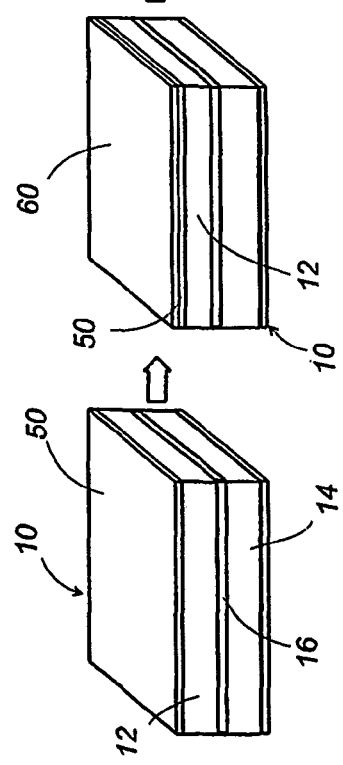
FIG. 3E  FIG. 3F  FIG. 3G
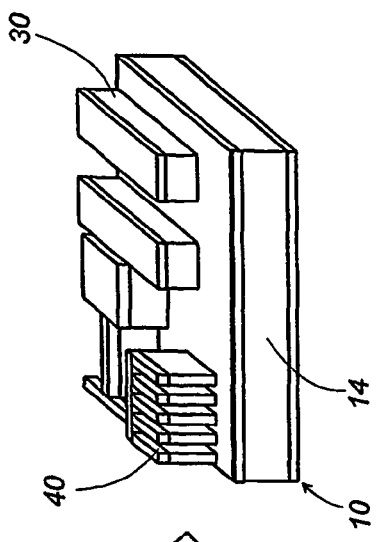
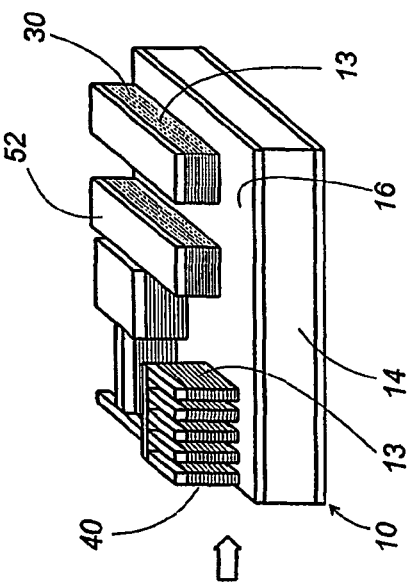
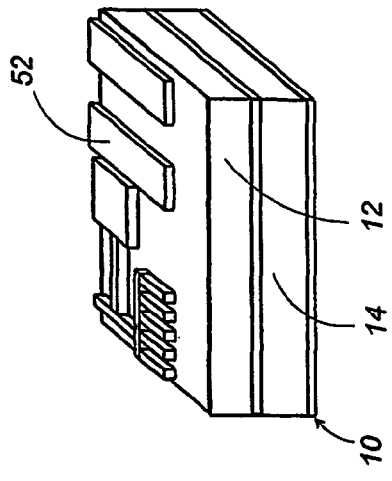

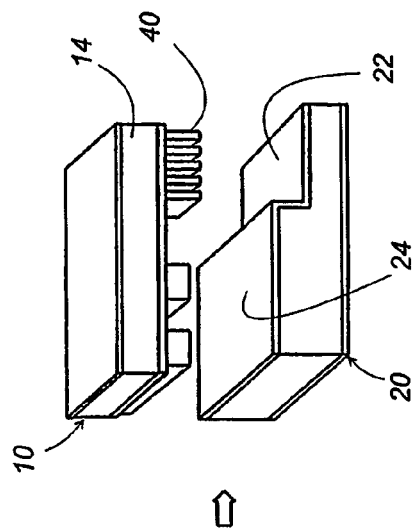
FIG. 4A  FIG. 4B  FIG. 4C
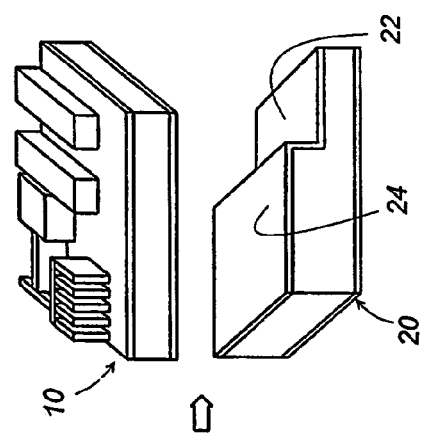
FIG. 4D
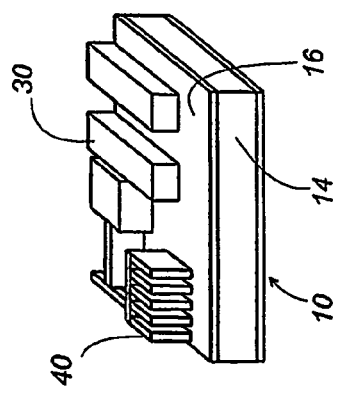
FIG. 4E  FIG. 4F  FIG. 4G
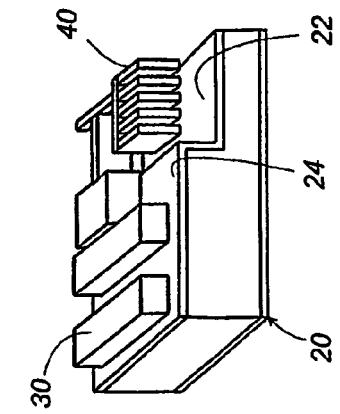
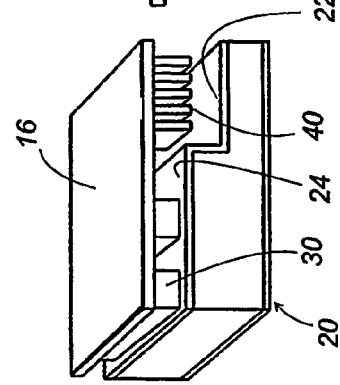
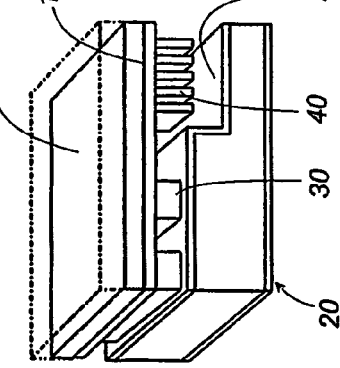
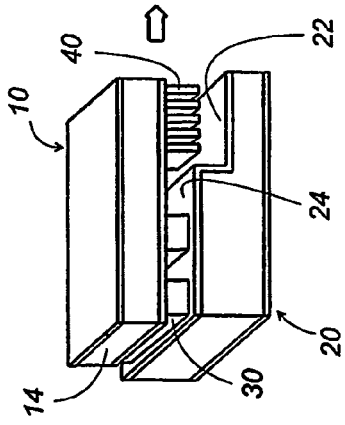

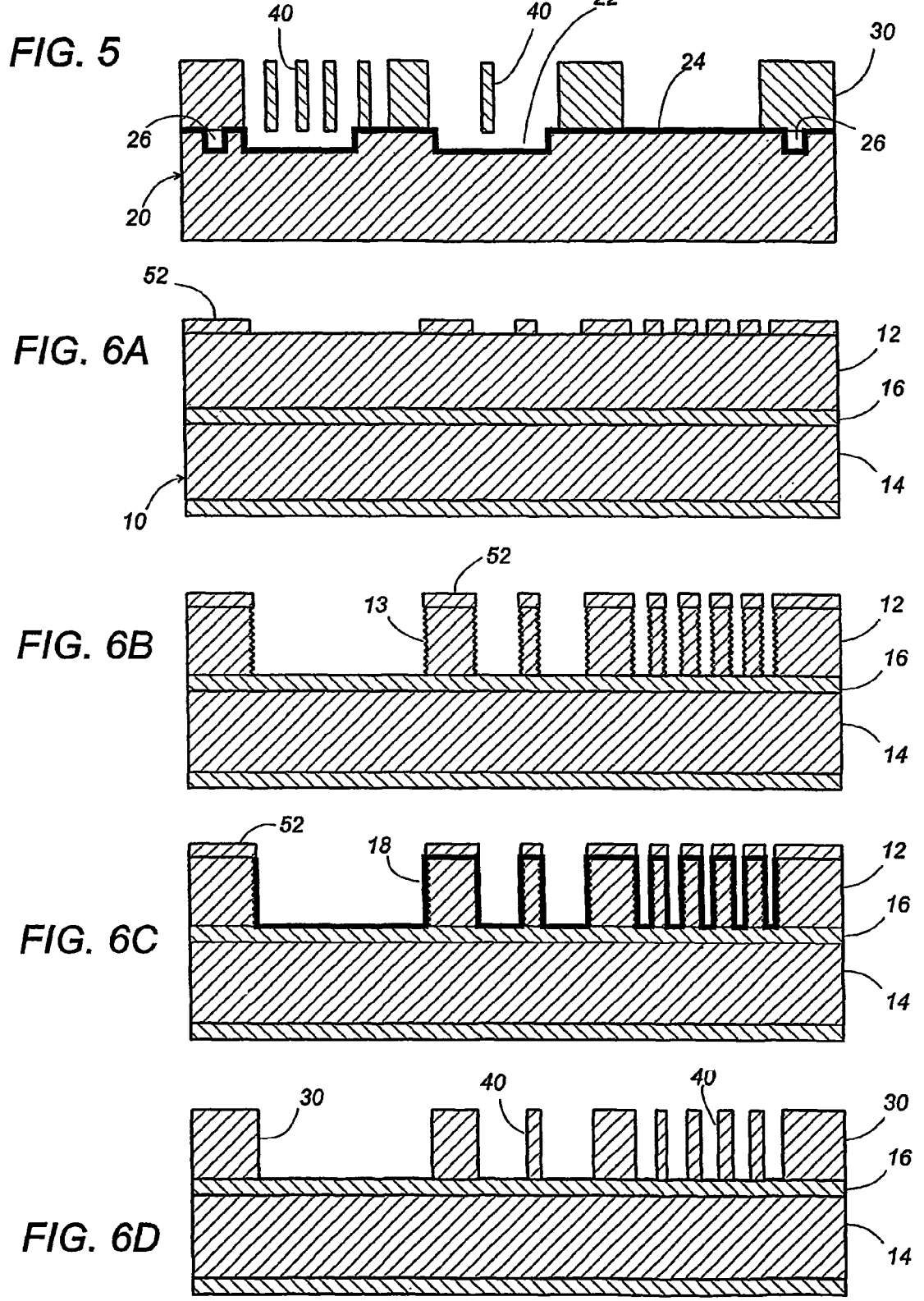

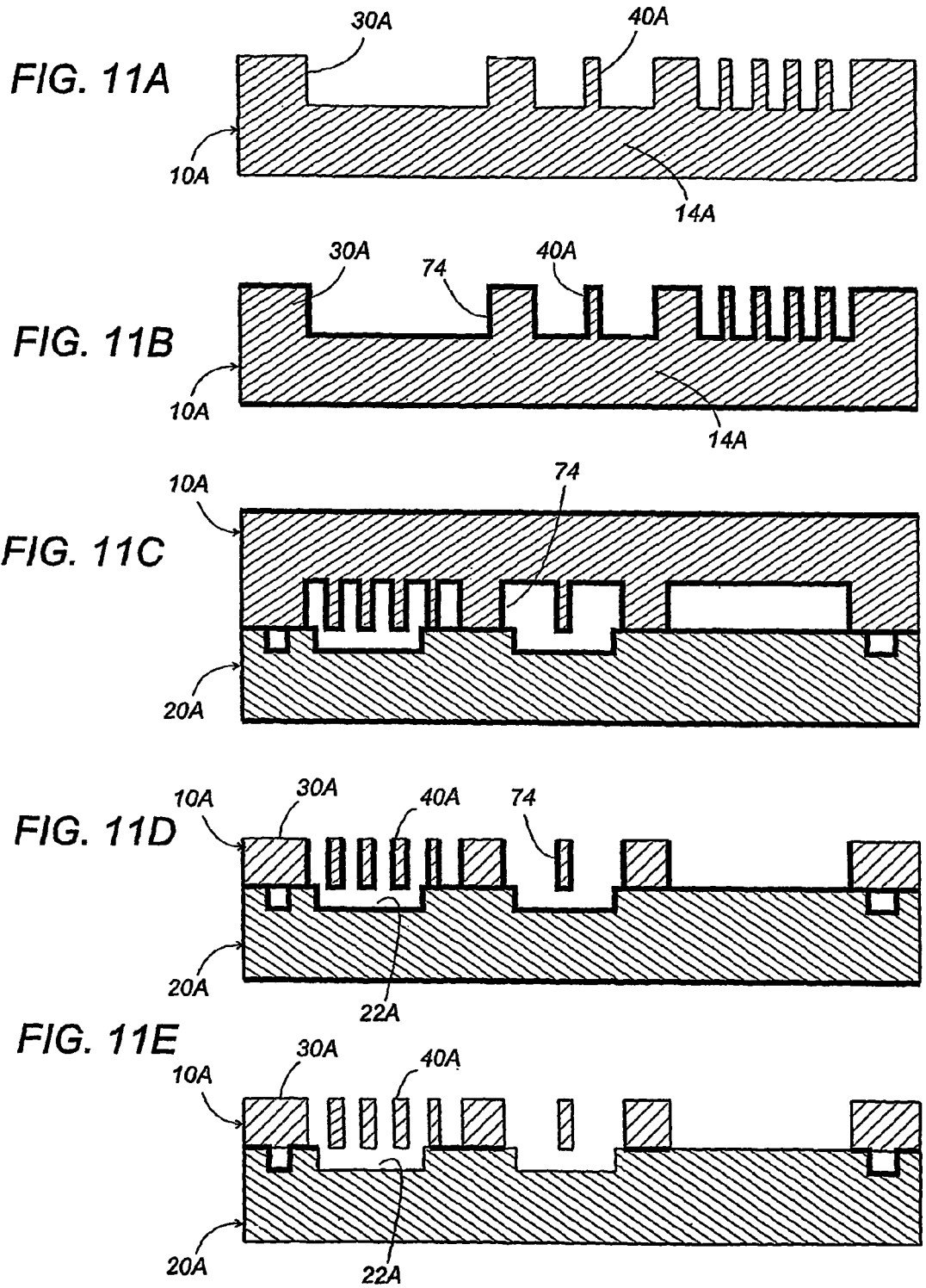

PROCESS FOR FABRICATING A MICRO-ELECTRO-MECHANICAL SYSTEM WITH MOVABLE COMPONENTS

TECHNICAL FIELD

The present invention relates to a process for fabricating a micro-electro-mechanical system (MEMS) composed of fixed components fixedly supported on a base and movable components movably supported on the base.

BACKGROUND ART

Japanese Patent Publication No. 03-230779 discloses a movable micromechanical system fabricated through microfabrication technology. The system includes fixed components and movable components both of which are formed from a common silicon substrate and are supported on a base made of a glass or semiconductor material. The common silicon substrate is etched to a limited depth or within a surface layer to form a plurality of posts which project commonly from a remainder layer of the silicon substrate. The posts include the fixed components and the movable components which are resiliently supported to one or more of the fixed components to be movable relative thereto. The silicon substrate is then bonded to the base with the fixed components being placed directly on top of the base and with the movable components being spaced from the top of the base. Thereafter, the silicon substrate is etched to remove the remainder layer or the common platform to release the fixed and movable components from the common platform such the movable components are free to move relative to the fixed components and therefore to the base. In order to assure the movable components free to move without being interfered with the base, it is required to reduce the height of the movable components in relation to the fixed components to give a sufficient gap between the top of the base and the movable components. Due to this structural requirement, the fixed components directly bonded to the base have to be designed to have a height much greater than the movable components. That is, as the gap is required to be greater for assuring the movable components free from being interfered with the base, the height of the fixed components are made to have greater height, which increases the overall height of the micromechanical system and therefore detract from the compactness generally expected to the system.

DISCLOSURE OF THE INVENTION

In view of the above insufficiency, the present invention has been accomplished to provide a unique process for fabricating a micro-electro-mechanical system (MEMS) composed of fixed components fixedly supported on a base and movable components movably supported on the base. The process utilizes an upper semiconductor substrate and a lower substrate which defines the base. A top layer in the upper substrate is selectively etched to form therein a plurality of posts which project commonly from a bottom layer of the upper substrate. The posts include the fixed components to be fixed to the lower substrate and the movable components which are resiliently supported only to one or more of the fixed components to be movable relative to the fixed components and the lower substrate. The lower substrate is also etched in its top surface to form therein at least one recess. The upper substrate is then bonded to the top of the lower substrate upside down in such a manner as to place the fixed components directly on the lower substrate and to place the movable components upwardly of the recess. Finally, the bottom layer of the upper substrate is removed to release the movable components from the bottom layer for floating the movable components above the recess and allowing them to move relative to the lower substrate, while keeping the fixed components fixed to the top of the lower substrate. By provision of the recess in the tops surface of the lower substrate, the fixed components can be sized to have the same height as the movable components and therefore not required to have an extra height for floating the movable components, thereby reducing the overall height of the system to give a low-profile microstructure.

The bottom layer of the upper substrate may be removed firstly by abrasion and subsequently by etching for facilitating to release the fixed and movable components.

Preferably, the upper substrate is of a SOI (silicon on insulator) structure having a buried oxide layer extending between the top layer and the bottom layer so that the resulting fixed and movable components are be supported on the bottom layer through the buried oxide layer. The bottom layer and the buried oxide layer are removed after the upper substrate is bonded to the lower substrate. In this case, the buried oxide layer can be utilized as a barrier to stop etching the bottom layer with respect to a specific etching method which is effective to remove the bottom layer but not to the oxide layer. This makes it possible to utilize the above specific etching method to remove the bottom layer and to utilize another etching method for removing the oxide layer for optimizing the step of releasing the components. This is particularly advantageous when the bottom layer is preliminary abrade or polished roughly to varying depths for expediting the step of removing the bottom layer, since the subsequent etching with the specific etching method can be stopped at the buried oxide layer irrespective of that the remaining bottom layer suffer from the different thicknesses. The buried oxide layer is preferably removed by the dry etching different from the above specific etching method. In this connection, it is preferred that all of the fixed and movable components are formed to have uniform height standing from the buried oxide layer.

Further, it is preferred that the fixed and movable components projecting on the buried oxide layer are covered with an oxidized coat. With the application of the oxidized coat, the components, which are likely to suffer from serrations or surface irregularities caused at the time of etching the upper layer, can be smoothed. The oxidized coat has a thickness less than the buried oxide layer, and is removed prior to the bonding of the supper substrate to the lower substrate, leaving the buried oxide layer in the upper substrate for use as the barrier.

In order to make the step of bonding the upper substrate to the lower substrate successfully, at least one of the upper and lower substrate is formed at the interface therebetween with a groove that extends to the exterior of the system from within an interior space confined between the upper and lower substrates. The groove acts to escape the air entrapped between the upper and lower substrates at the bonding thereof, enabling to register the upper substrate to the lower substrate successfully and precisely.

The movable components may be formed to have a height shorter than that of the fixed component to give an increased gap in combination with the recess as necessary.

In order to provide the short movable components by etching, the upper substrate may be covered with a mask composed of a first mask covering a portion later formed into the fixed component (30) and a second mask covering a portion later formed into the movable component and also the first mask. The composite mask is etched together with the top layer of the upper semiconductor substrate to such an extent as to reduce the height of the movable component relative to that of the fixed component. Thus, the composite mask acts as an etching depth adjustor to differentiate the height of the fixed and movable components. The first mask is preferably made from a material which is etched at a low etching rate the second mask.

The lower substrate is preferably be covered on its top surface with a dielectric layer for electrically isolating the components from the lower substrate, enabling to electrically insulate particular one or ones of the components from the other. When the lower substrate is made of a semiconductor material, the dielectric layer may be formed by oxidizing the top surface of the substrate.

For protecting the components from being attacked during the step of etching away the bottom layers of the upper semiconductor substrate, it is preferred to cover the parts with an etching-shield prior to bonding the upper substrate to the lower substrate. The etching-shield may be formed by thermally oxidizing the surfaces of the post. In this case, the etching shield is firstly formed on the entire exposed faces of the components and is removed after the components are released from the bottom layer.

The components are in many cases designed to be spaced by different inter-distances so that cavities of different widths are to be left between the adjacent ones of the components after the top layer of the upper substrate is etched. During the etching, the growing cavities of greater width are very likely to be etched to a greater depth, which causes the finished cavities to have different depths. In such case, the bottoms of the cavities are not aligned in the same level, necessitating complicated and cumbersome control in the step of accurately etching away the bottom layer of the upper substrate for releasing release the fixed and movable components from the bottom layer. Therefore, it is practically desirable to align the bottoms of the cavities in the same level for terminating the etching simply at this level when releasing the components, irrespective of the design requirement of spacing the components at varying inter-distances. The present invention gives one approach to align the bottom of the cavities by introducing dummy projections between the components spaced by a large distance from each other. The dummy projections are formed in the top layer of the upper substrate together with the components at such a location as to leave, between the adjacent ones of the dumpy projections and the components, the cavity of which width is generally equal to the that of the remaining cavity or cavities. Thus, the top layer can be etched to the same depth so as to align the bottoms of all the resulting cavities. For this purpose, the dummy projections are selected to have having a width smaller than the components (30, 40) and are anchored to the buried oxide layer. The buried oxide layer confined between the dummy projections and the bottom layer is etched away to release the dummy projections, before the upper substrate is bonded to the lower substrate.

Further, the present invention gives a control of etching away the bottom layer to release the fixed and movable components successfully, even in the presence of the cavities of different widths or depths. With the presence of the cavities of the different depths, the bottom layer is required to be etched to different depths at portions corresponding to the cavities for successfully releasing the components from the bottom layer. In a preferred embodiment of the present invention, it is contemplated to adjust the etching depth or the etching rate such that the etching advances to the bottoms of all the cavities simultaneously. For this purpose, the upper substrate is etched in its bottom to form a plurality of shelves which project on the bottom of the upper substrate in registration with deep ones of the cavities. The shelf is given a thickness which is proportional to the depth of the associated cavities. The bottom layer is etched away together with the shelves, after the upper substrate is bonded to the lower substrate, to release the fixed and movable components from the bottom layer.

Instead of forming the shelves by etching, it may be possible to utilize a mask which is deposited on the bottom of the upper substrate. The mask covers areas in registration with the cavities and has a thickness which is proportion to the depth of the associated cavity. The mask is etched away together with the bottom layer for releasing the fixed and movable components from the bottom layer of the upper substrate.

In many applications, it is required to electrically Isolate one or more of the components into two zones but to keep the zones mechanically integrated. To give a solution to the requirement, it is preferred to embed a dielectric member in the top layer of the upper substrate at a portion to be formed into one of the components. The dielectric member penetrates through a portion of the top layer so as to electrically divide the resulting component into two zones for electrical insulation therebetween while keeping the zones mechanically integrated with each other.

The present invention also provides a system which is fabricated by the above step. The system includes the lower substrate, and the upper substrate bonded to the lower substrate. The upper substrate is composed of the fixed components fixed to the lower substrate, and the, movable components that are resiliently coupled to one or more of the fixed components to be movable within a plane of the upper substrate relative to the lower base. The movable components are adapted to receive an electric potential relative to the fixed components for developing an electrostatically attracting force by which the movable components are drive to move. The lower substrate is formed in its top surface with at least one recess above which the movable components are located, affording a sufficient gap between the movable components and the lower substrate without critically differentiating the heights of the movable and fixed components. With this arrangement, the fixed components are only required to have the reduced height substantially equal to that of the movable components, which contributes to make the system of a low profiled type.

These and still other advantageous features of the present invention will be apparent from the following detailed description of the preferred embodiments when taken in conjunction with the attached drawings.

BRIEF DESCRIPTION OF THE DRAWINGS

FIGS. 3A to 3G and FIGS. 4A to 4G are perspective views illustrating major steps included in the above process for fabricating the system;

FIG. 5 is a vertical section of the finished system;

FIGS. 6A to 6D and FIGS. 7A to 7F are sectional views illustrating in sequence the steps of realizing the system having the section of FIG. 5;

FIGS. 10A to 10E and FIGS. 11A to 11E are sectional vies illustrating in sequence the steps of another process in accordance with a second embodiment of the present invention;

BEST MODE FOR CARRYING OUT THE INVENTION

Figure 1:
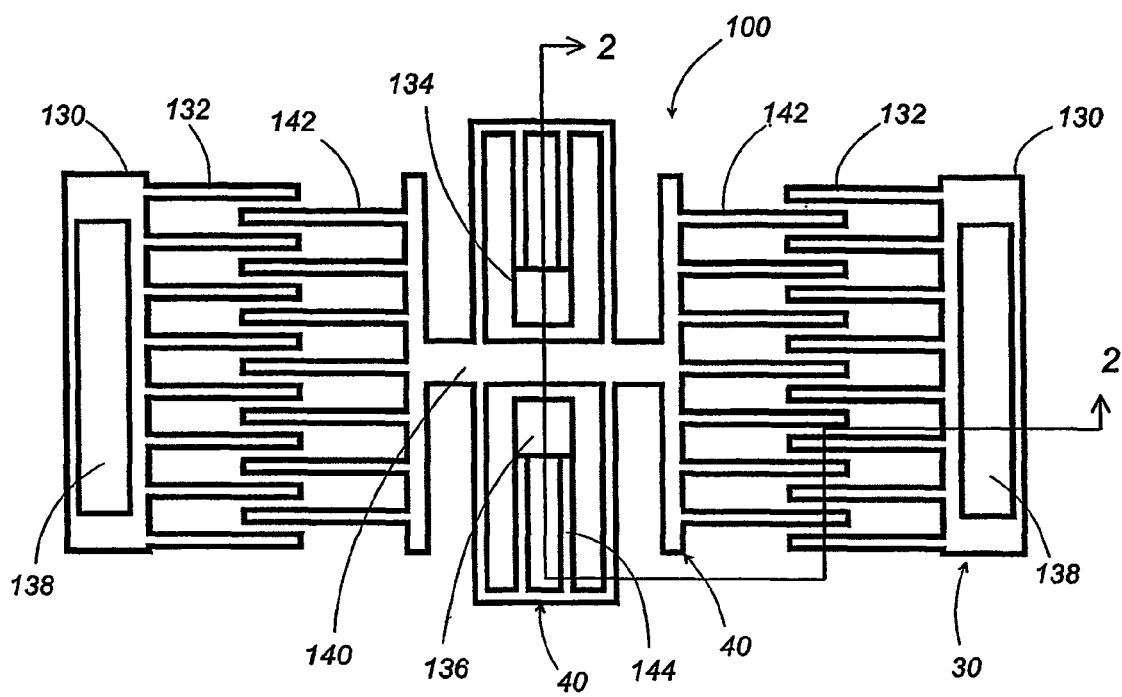
FIG. 1 is a top view of an actuator system, one example of a micro-electro-mechanical system fabricated through a process in accordance with a preferred embodiment of the present invention.
Figure 2:
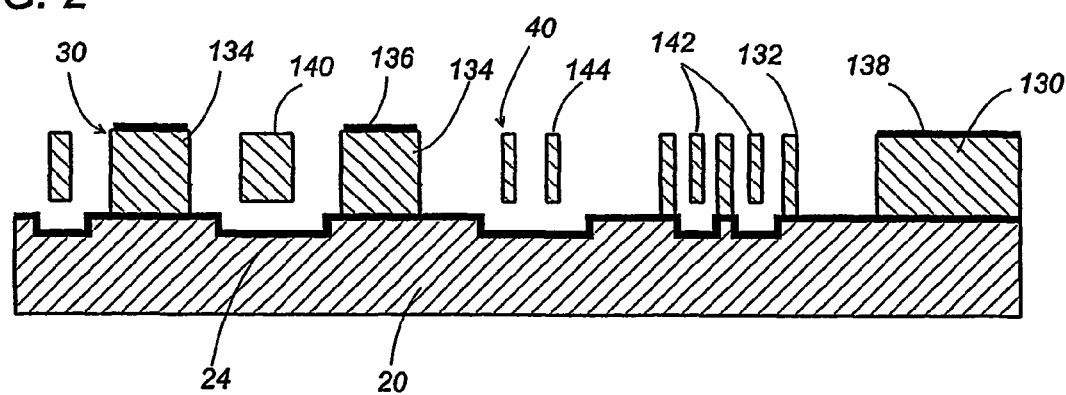
FIG. 2 is cross-section take along line 2-2 of FIG. 1.

Referring to FIGS. 1 and 2, there is shown an actuator system 100, one example of a micro-electro-mechanical system (MEMS) fabricated by the process of the present invention. Basically, the system is composed of fixed components 30 anchored to a base 20 and movable components 40 that are resiliently supported to one or more of the fixed components 30 in a floating relation to the base 20 so that the movable components 40 are movable relative to the base. 20. In the illustrated actuator system, the fixed components 30 define a pair of side effectors 130 each including a comb-shaped fixed electrode 132, and also define anchor studs 134. The movable components 40 define an actuator 140 having a comb-shaped movable electrode 142 and springs 144 by which the actuator 140 is resiliently supported to the anchor studs 134. The actuator 140 is driven to move along a linear path towards either one of the side effectors 130 by an electrostatically attracting force developed between the actuator 140 and one of the side effectors 130. For this purpose, the anchor studs 134 and the side effectors 130 are formed respectively with terminals 136 and 138 that are electrically connected to an external voltage source to develop the electrically attracting force. The base 20 is formed on its top with a dielectric oxide layer 24 for electrically isolating the anchor studs 134 or the actuator 140 from the side effectors 130.

Now, the process of fabricating the system is explained with reference to FIGS. 3 to 7 where the system is schematically shown to include the movable components 40 and the fixed components 30 which are finally placed on the base 20. FIG. 5 shows a section of the system. FIGS. 3 and 4 illustrate the process step-by-step in the perspective views, while FIGS. 6 and 7 illustrate the same in the sectional views in correspondence to FIG. 5. Prior to explaining the process, it is noted that the process utilizes an upper silicon substrate 10 and a lower silicon substrate that define the base 20, although the substrates may be selected from any other suitable semiconductor material. Further, the above process is applied to a single silicon wafer for each of the substrates to realize a plurality of modules each constituting the system simultaneously. Therefore, the vertical sections shown in the perspective views of FIGS. 3 and 4 are not actually exposed but shown simply only for easy understanding of the process with reference to the single module of the system.

The upper substrate 10 is provided in the form of a silicon-on-insulator (SOI) structure to have a top layer 12 and a bottom layer 14 divided by a buried oxide layer 16. The upper substrate 10 is etched in its top layer 12 to develop the fixed and movable components 30 and 40, and is subsequently bonded to the lower substrate 20 to give a consolidated structure in which the components are supported on the lower substrate 20.

<Processing of the Upper Substrate>

At the first step, the upper substrate 10 is thermally oxidized or treated with chemical-vapordeposition (CVD) to form an oxide layers 50 of uniform thickness on its top and bottom, as shown in FIG. 3A. Then, a photo-resist film 60 is applied on the entire top oxide layer 50, as shown in FIG. 3B, followed by being selectively removed to leave a resist pattern 62 on the oxide layer 50, as shown in FIG. 3C. Subsequently, the top oxide layer 50 not covered by the resist pattern 62 is etched away by the known CHF3 etching plasma, as shown in FIG. 3D, after which the resist pattern 62 is removed by the oxygen plasma to leave a mask 52 of the oxide layer on top of the substrate 10, as shown in FIG. 3E and FIG. 6A With the mask 52 on the upper substrate 10, the top layer 12 of the upper substrate 10 is dry-etched by the deep reactive ion etching (DRIE) by a depth of about 100 μm down to the buried oxide layer 16 to form the fixed components 30 and the movable components 40 commonly projecting and supported on the bottom layer 14 through the buried oxide layer 16, as shown in FIGS. 3F and 6B. At this time, the side faces of the components suffer from serrations 13 of about 0.2 μm depth which are inevitably accompanied by the deep reactive ion etching. In order to remove the serrations 13 or the surface irregularities, the components are thermally oxidized be covered with an oxidized coat 18, as shown in FIGS. 3G and 6C, which is thereafter etched away together with portions of the serrations 13 by exposing the top of the upper substrate 10 to a wet etching medium, for example, a hydrofluoric acid solution. In this wet etching, the mask 52 is also etched away to give the structure, as shown in FIGS. 4A and 6D, in which the fixed and movable components 30 and 40 project on the bottom layer 14 with the side faces of the components being finished smooth.

<Processing of the Lower Substrate>

Figure 7A:
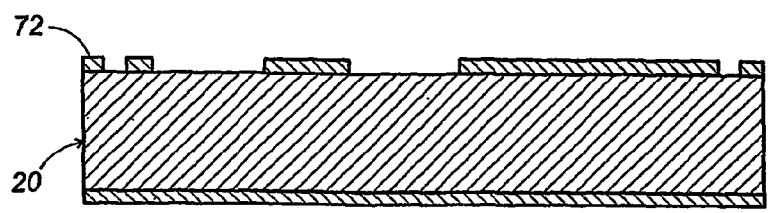
Figure 7B:
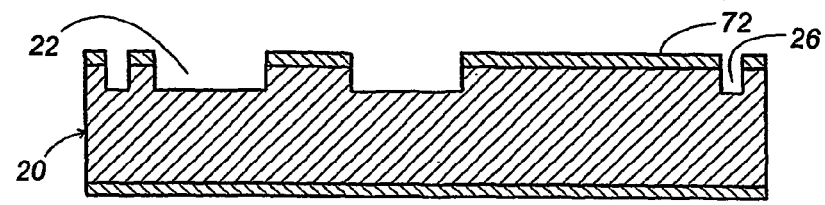
Figure 7C:
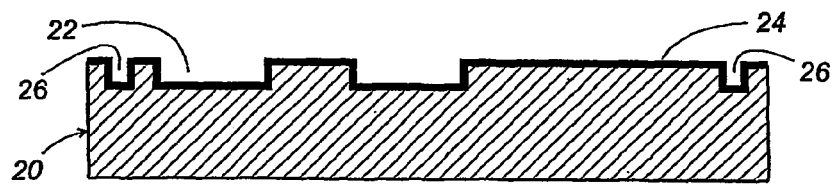

By this time, the lower substrate 20 is etched to give a recess 22 in its top surface in registration with the movable components 40 of the upper substrate 10 through the steps of FIGS. 7A to 7C. Prior to being etched, the lower substrate 20 is thermally oxidized or treated with the CVD treatment to form on its top and bottom oxide layer, and is then masked with a resist pattern and removed of the oxide layer not covered by the resist pattern, after which the resist pattern is etched away by the CHF3 etching plasma to leave a mask 72 of the top oxide layer as shown in FIG. 7A. The above preliminary treatments are made in the like manner as is made for the upper substrate explained with reference to FIGS. 3A to 3E. With the mask 72 on its top surface, the lower substrate 20 is etched to form the recesses 22 of about 5 μm to 10 μm depth, as shown in FIG. 7B. The etching is made either by wet-etching using a potassium hydroxide or by dry-etching with the deep reactive ion etching (DRIE). hereafter, the lower substrate 20 is removed of the mask 72 by an etching medium, for example, a hydrofluoric acid solution, followed by being thermally oxidized to form dielectric oxide layers 24 of dielectric nature on its top and bottom, as shown in FIGS. 7C and 4B.

Although not shown in FIG. 4, the lower substrate 20 is additionally formed in its top surface with grooves 26. The grooves 26 are formed simultaneously with the recesses 22 in order to release the air entrapped between the upper substrate 10 and the lower substrate 20 at the time of bonding the substrates, facilitating the bonding procedure. For this purpose, the grooves 26 is designed to extend at the interface between the upper substrate 10 and the lower substrate 20 from within an interior space of the system to the exterior of the system. That is, the grooves 26 is formed in the wafer forming the lower substrate 20 to run from portions to be bonded to the fixed components 30 to a point outside of the portion mating with the upper substrate 10 through any portion giving a confined interior spaces with the upper substrate. When the upper substrate 10 is so designed as to leave an open space at portions other than the fixed components 30, the grooves 26 are suffice to run from the portions mating with the fixed components 30 to the point outside of the portion mating with the upper substrate 10.

<Bonding the Upper Substrate to the Lower Substrate>

Figure 7D:
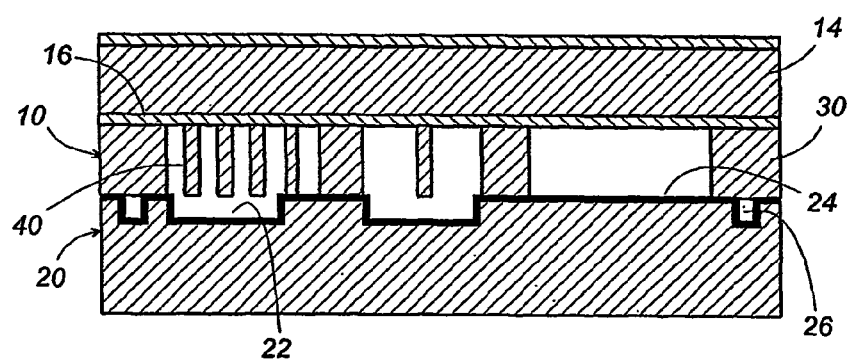
Figure 7E:
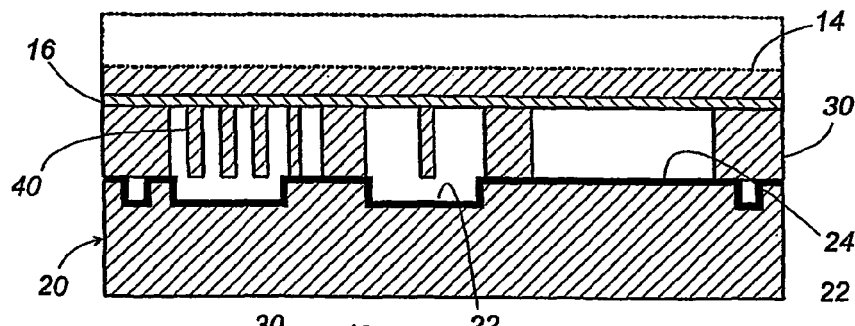
Figure 7F:
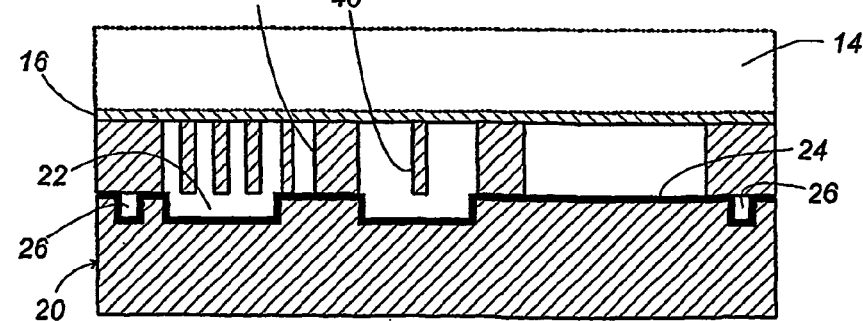

As shown in FIGS. 4B and 7D, the upper substrate 10 thus prepared is then placed on the lower substrate 20 upside down, as shown in FIGS. 4C and 4D, and FIG. 7D, with the fixed components 30 bonded to the top of the lower substrate 20 and with the movable components 40 floated above the recesses 22. The bonding is accomplished by heat-pressing the upper substrate 10 at the fixed components to the top of the lower substrate 20. Finally, the bottom layer 14 of the upper substrate 10 is removed to leave only the fixed components 30 and the movable components 40 on and above the top of the lower substrate 20, as shown in FIG. 4G. The removal of the bottom layer 14 is made firstly by abrasion with the chemical-mechanical polishing (CMP) treatment to a depth short of the oxide layer 16, as shown in FIGS. 4E and 7E, and then by dry-etching with the inductively coupled plasma (ICP) down to the oxide layer 16, as shown in FIGS. 4F and 7F. Finally, the oxide layer 16 is removed by use of the CHF3 etching plasma to reveal only the fixed and movable components 30 and 40 supported on the lower substrate 20, as shown in FIGS. 4G and 5. Thus, the fixed components and the movable components are supported on the lower substrate 20 through the dielectric oxide layer 24 so that the separate ones of the components can be electrically isolated by way of the dielectric oxide layer 24 from each other. It is noted in this connection that the oxide layer 16 is best utilized as a barrier to stop etching the bottom layer 14 with inductively coupled plasma (ICP), thereby leaving only the oxide layer 16 of uniform thickness. In other words, even when the preliminary abrasion or polishing causes the remaining bottom layer 14 to suffer from different thicknesses from portions to portions, the etching away of the remaining bottom layer can be stopped at the oxide layer 16. With this result, the subsequent etching step of removing away the oxide layer 16 by use of CHF3 etching plasma can be easily controlled in order to release the fixed and movable components from the oxide layer 16 successfully without causing over-etching and under-etching. Although not illustrated in the figures, the wafer is thereafter divided into the individual modules each constituting the actuator system.

Figure 8:
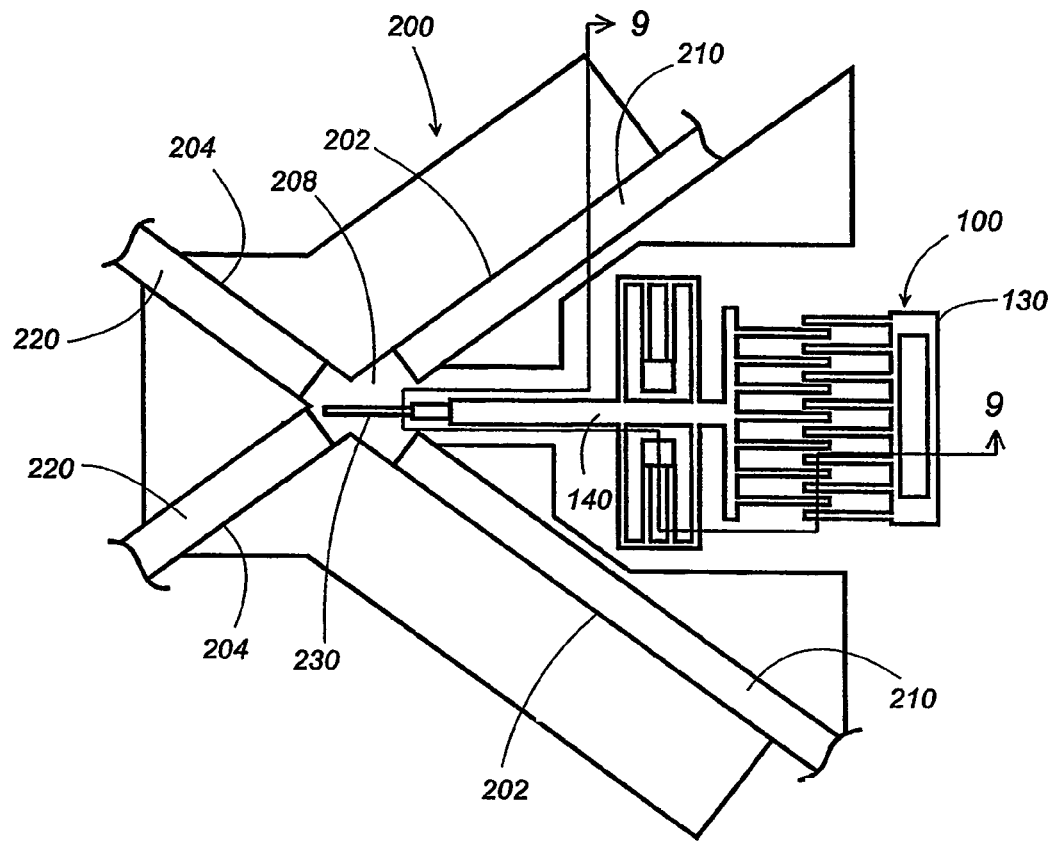
FIG. 8 is a plan view of an optical switch as one application of the above system.
Figure 9:
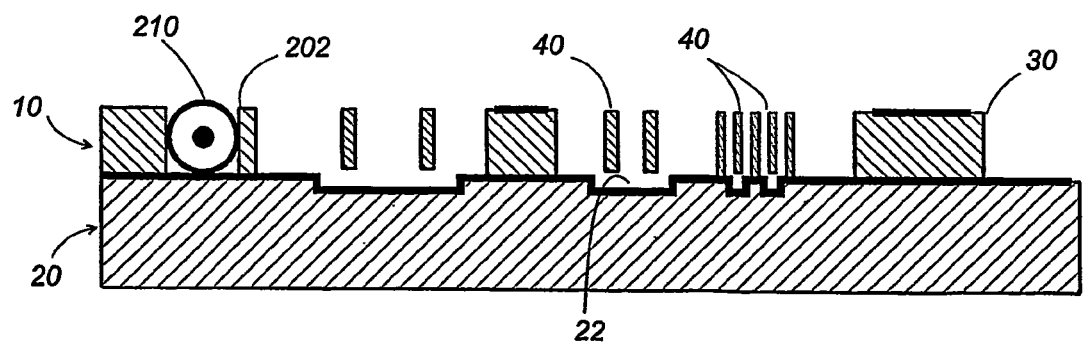
FIG. 9 is a cross-section take along line 9-9 of FIG. 8.
Figure 10A:
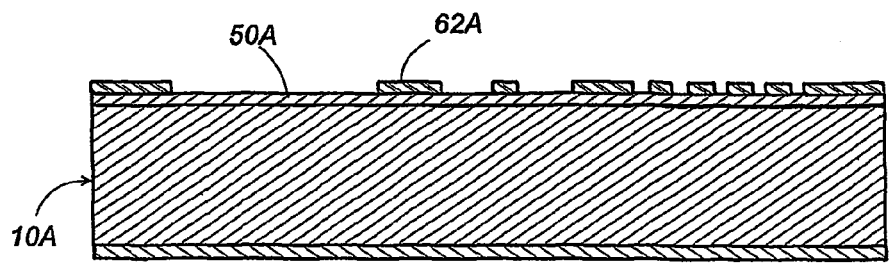
Figure 10B:
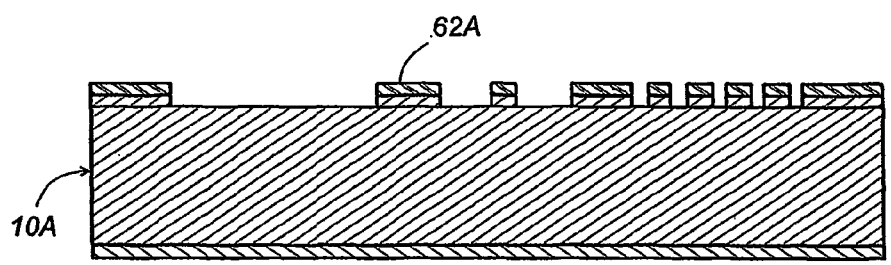
Figure 10C:
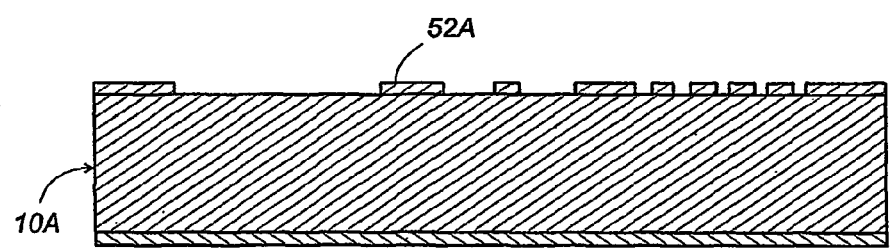
Figure 10D:
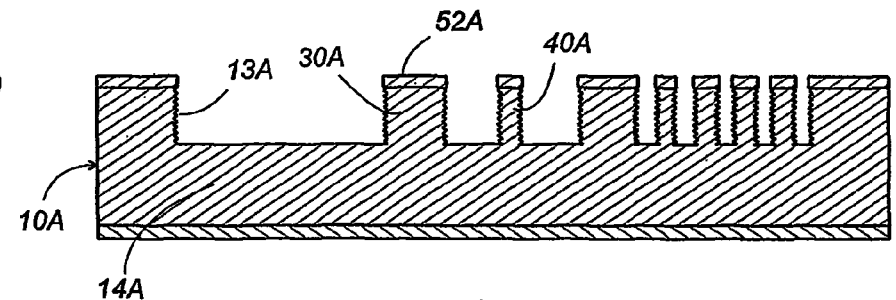
Figure 10E:
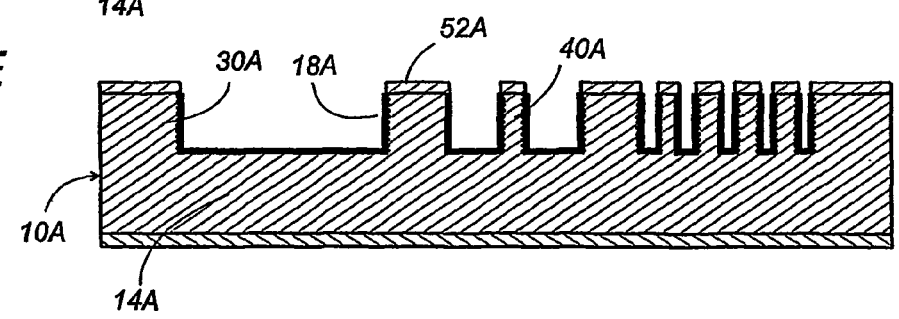
Figure 12A:
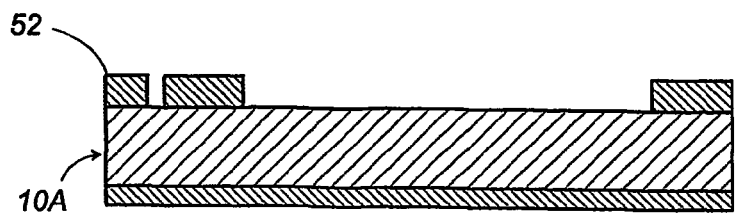
FIGS. 12A to 12G are sectional views illustrating in sequence the steps of another process in accordance with a third preferred embodiment of the present invention.
Figure 12B:
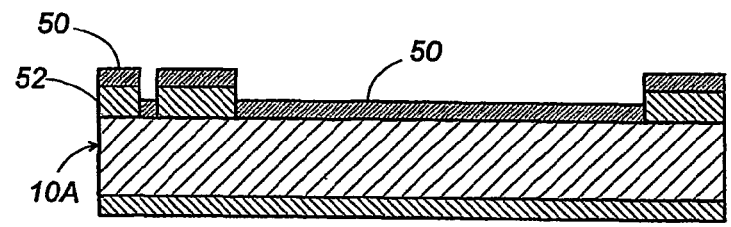
Figure 12C:
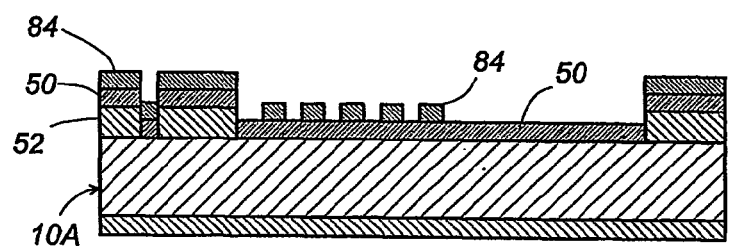
Figure 12D:
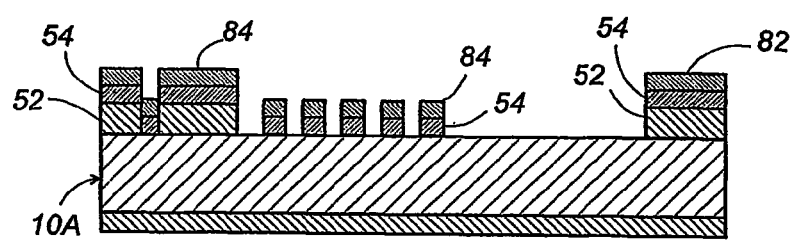
Figure 12E:
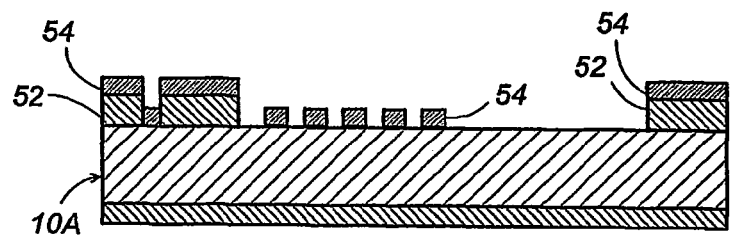
Figure 12F:
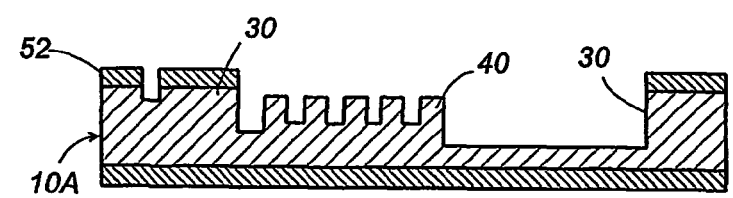
Figure 12G:
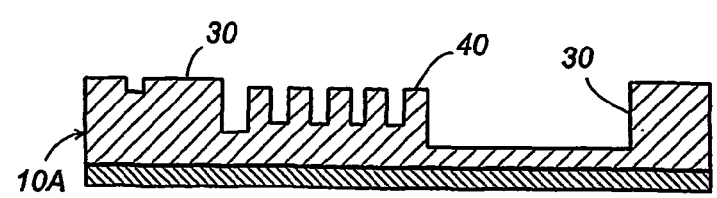

FIGS. 8 and 9 illustrate an optical switch, as one application of the present invention. The optical switch 200 incorporates a like actuator system 100 composed of a fixed effector 130 and an actuator 140, and is designed to be of cross-connect type having two input light guides 202 and two output light guides 204 respectively for connection with input and output optical fibers 210 and 220 in order to pass an incoming light signal through each of the input optical fibers to the selected one of the output optical fibers. A mirror 230 is carried by the actuator 140 to be driven thereby to shift between a projected position and a retracted position along a linear path. In the projected position, which is shown in FIG. 8, the mirror 230 is enabled to reflect the light signal from each of the input light guides 202 at an angle to each of the output light guides 204 arranged in an angled relation with the input light guides 202. In the retracted position, the mirror 230 is retracted away from a cross yard 208, allowing the light signal from each of the input light guides 202 to proceed straight to each of the aligned output light guides 204. The light guides 202 and 204 and the mirror 230 are also formed together with the components of the actuator system commonly from the upper substrate 10, and is bonded on to the lower substrate 20, in accordance with the process as discussed in the above.

Second Embodiment

<FIGS. 10 and 11>

FIGS. 10 and 11 illustrate a process for fabricating the like a micro-electro-mechanical system (MEMS) in accordance with the second preferred embodiment which is similar to the above embodiment except for the use of the upper semiconductor substrate 10A made of a bare silicon monocrystal. The upper substrate 10A is firstly coated on its top with an oxide layer 50A formed by the thermal oxidation or the CVD process, and is masked With a resist pattern 62A, as shown in FIG. 10A. Then, the oxide layer 50 is etched to leave a mask 52A on top of the upper substrate 10A (FIG. 10B), after which the resist pattern 62A is removed off (FIG. 10C). Then, the upper substrate 10A is treated with the deep reactive ion etching (DRIE) to form the fixed components 30A and the movable components 40A commonly projecting on the bottom layer 14A of the upper substrate 10A, as shown in FIG. 10D. Next, the exposed faces of the components 30A and 40A are thermally oxidized in order to eliminate serrations 13A appearing on the faces of the components as a result of the deep etching. The resulting oxide coat 18A left on the faces of the components (FIG. 10E) is removed together with the mask 52A also of made of silicon oxide by use of the hydrofluoric acid solution to give a structure of FIG. 11A, in which the faces of the components are smoothed.

Subsequently, the upper substrate 10A is again thermally oxidized or treated with the CVD process to give an etching-shield 74 covering the exposed surfaces including the faces of the components 30 and 40, as shown in FIG. 11B. Then, in the like manner as explained in the first embodiment, the upper substrate 10A is placed upside down upon the lower substrate 20A and is bonded thereto with the fixed components 30A fixed to the top of the lower substrate 20A and with the movable components 40A disposed respectively above the recesses 22A, as shown in FIG. 11C. Then, the bottom layer 14A of the upper substrate 10A is etched away by applying the inductively coupled plasma (ICP) in order to release the components 30A and 40A, as shown in FIG. 11D. Since the ICP etching proceeds at a high etching rate, it is likely to attack the components at the last stage of nearly completing to etch away the bottom layer 14A. However, the etching-shield 74 protects the components from being attached and keeps them intact after the components are completely released. Finally, the etching shield 74 is etched away by use of the CHF3 plasma, thereby realizing the structure, as shown in FIG. 11E.

Third Embodiment

<FIG. 12>

FIG. 12 illustrates a process for fabricating the like a micro-electro-mechanical system (MEMS) in accordance with the third preferred embodiment which is similar to the above embodiment except that it is contemplated to make the movable components 40A shorter in its height than the fixed components 30A. The movable components 40A may be required to be given a height shorter than the fixed components 30A for reason of leaving a large gap on the lower substrate 20A and/or adjusting the mechanical characteristics. In order to differentiate the height of the fixed and movable components, the present embodiment utilizes a composite mask composed of a first mask 52 and a second mask 54 which is etched at a higher rate than the first mask 52 but at a lower rate than the upper substrate 10A, i.e., silicon, when subjected to the same etching treatment. FIG. 12A shows the first mask 52 which is formed by selectively removing or etching away portions of the oxide layer formed on top of the upper substrate 10A in the same manner as discussed in the first embodiment with reference to FIGS. 3A to 3E. Then, the upper substrate 10A is thermally oxidized or treated with the CVD process to form an additional oxide layer 50 of uniform thickness covering the entire top surface of the upper substrate including the first mask 52, as shown in FIG. 12B. Subsequently, with a resist pattern 84 deposited on the additional oxide layer 50, as shown in FIG. 12C, the upper substrate 10A is etched to selectively remove the portions of the additional oxide layer 50 to develop the second mask 54 on the upper substrate 10 and also on the first mask 52, as shown in FIG. 12D, after which the resist pattern 84 is removed to realize the composite mask, as shown in FIG. 12E. Then, the upper substrate 10 thus covered with the composite mask is treated with the deep reactive ion etching (DRIE) until the second mask 54 is completely etched away, as shown in FIG. 12F. At this time, the unmasked portions of the upper substrate 10 is etched deep to form the movable components 40, while keeping the fixed components 30 covered by the first mask 52 which has been etched only to some extent. Finally, the first mask 52 is removed from the top of the upper substrate 10 by use of the hydrofluoric acid solution, revealing the fixed components, as shown in FIG. 12G. Thus, the upper substrate 10A is processed to give different heights within a range of 5 to 10 μm to the fixed and movable components by use of the composite mask. Although the present embodiment is explained with the use of the upper substrate made of the bare silicon, the above process can be equally applied to the SOI structure as utilized in the first embodiment.

Fourth Embodiment

<FIG. 13>

Figure 13:
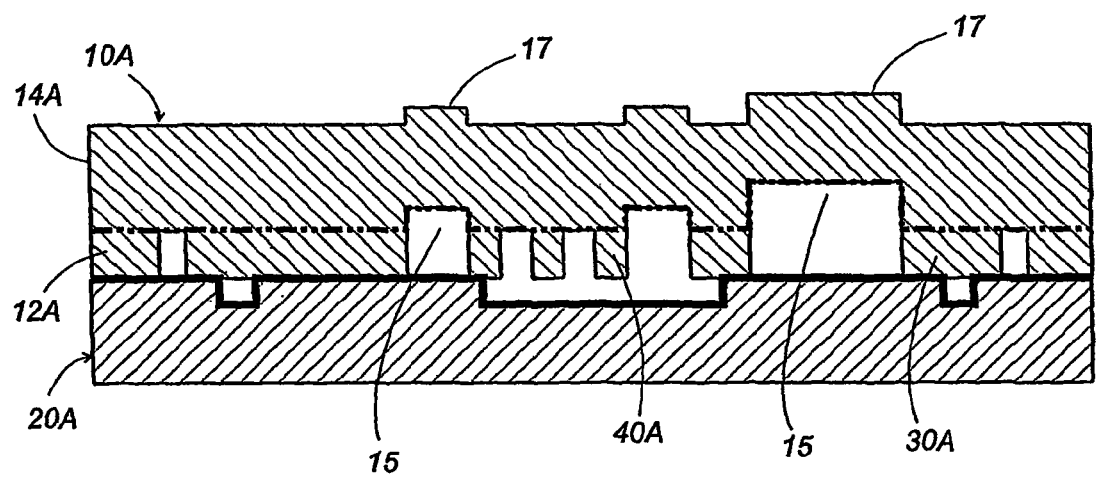
FIG. 13 is a sectional view illustrating a process in accordance with a fourth embodiment of the present invention.
Figure 14:
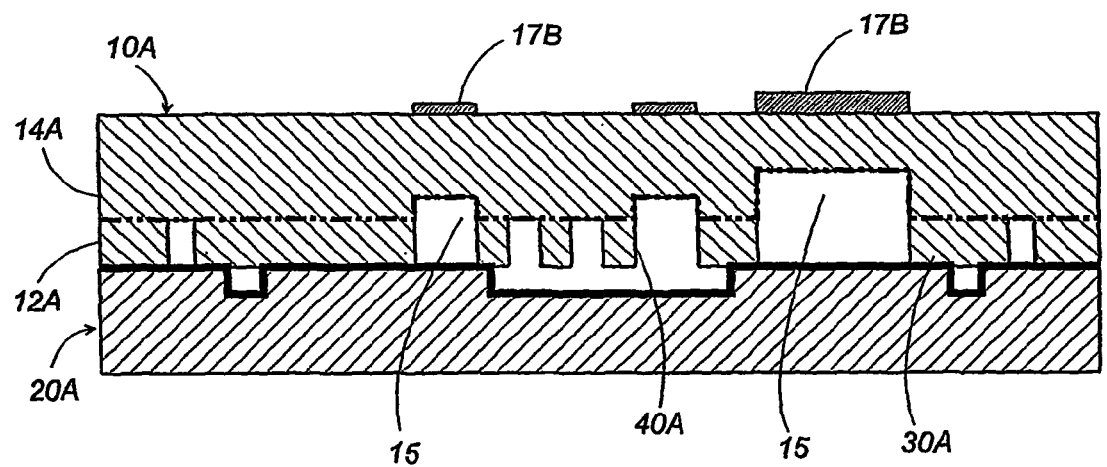
FIG. 14 is a sectional view illustrating a modification of the above process.
Figure 15A:
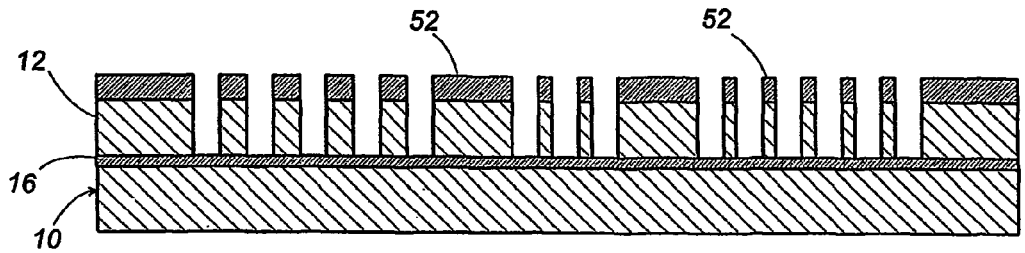
FIGS. 15A to 15E are sectional views illustrating in sequence the steps of a process in accordance with a fifth embodiment of the present invention.
Figure 15B:
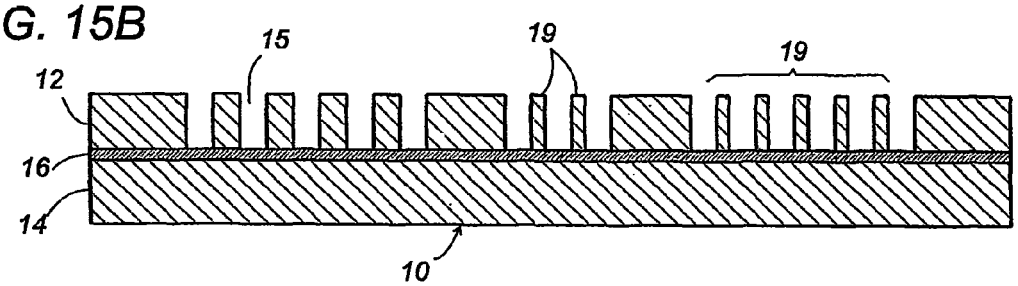
Figure 15C:
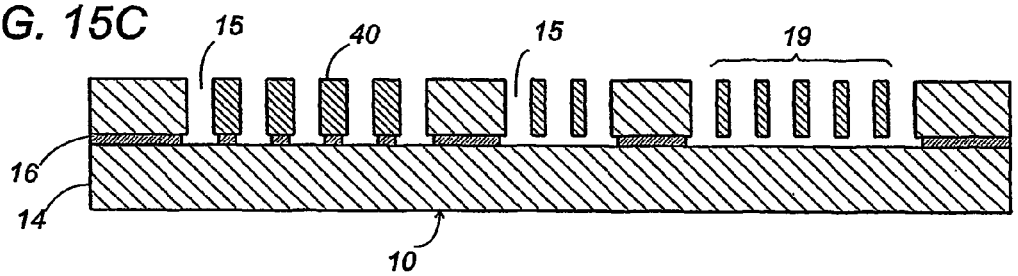
Figure 15D:
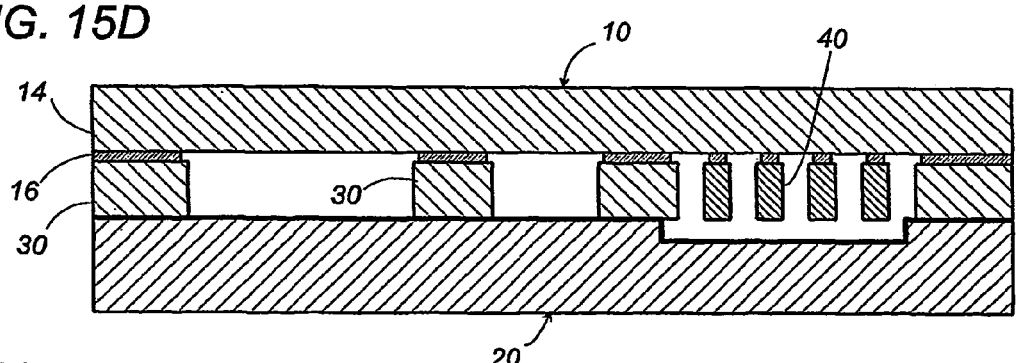
Figure 15E:
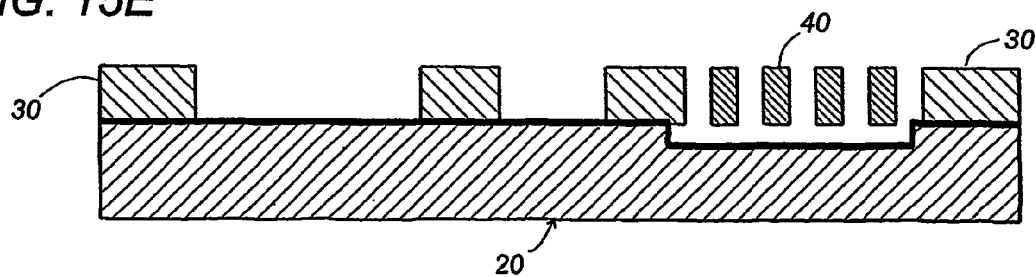

FIG. 13 illustrates a useful scheme of etching away the bottom layer 14A of the upper substrate 10A in accordance with a fourth embodiment of the present invention. The present embodiment is particularly useful in case where the components are designed to be spaced laterally by largely varying widths, and where the upper substrate 10A is devoid of the buried oxide layer. In such case, cavities 15 of greatly different widths are to be left between the adjacent ones of the posts or the components 30A and 40A after the top layer 12A of the upper substrate 10A is etched away. It is true that, during the etching of the top layer, the growing cavities of greater widths are likely to be etched to a greater depth, which causes the finished cavities to have different depths, failing to align the bottoms of the cavities in the same level. Irrespective of the misaligned bottoms of the cavities, the present embodiment gives an easy etching control for releasing the components 30A and 40A from the bottom layer 14A of the upper substrate 10A.

For this purpose, the bottom surface of the upper substrate 10A is formed with shelves 17 which are in exact registration with the cavities 15, and each of which has a thickness is proportional to the depth of the associated cavity. The shelves 17 are obtained by selectively etching portions of the bottom surface of the upper substrate 10A. The thickness of the shelves 17 is controlled by varying the etching depth portions by portions. With the addition of the shelves 17, the etching of the bottom layer 14 can advance to the bottoms of all the cavities by a uniform rate, thereby releasing all of the components from the bottom layer 14A successfully. This means that, as indicated by the dotted lines in the figure, the etching depth is made uniform throughout the bottom layer 14A so that the etching can be easily controlled simply by the etching time.

FIG. 12 illustrates a modification of the above process which is similar to the above embodiment except that the shelves 17B is formed through the steps of firstly forming a field oxide layer (SiO$_2$) on the bottom of the upper substrate 10A and then etching away portions of the oxide layer to leave the shelves or mask 17B on the bottom of the upper substrate. In this modification, the thickness of the masks 17B is controlled by differentiating the thickness of the field oxide layer portions by portions, or by repeating the formation of the field oxide layer and etching portions thereof on the areas to be provided with the masks 17B of greater thickness. The masks 17B thus made of the silicon oxide is etched at a rate lower than the rest of the upper substrate of silicon, which guarantees the effect of successfully removing the bottom layer 14A of the upper substrate 10A for releasing the components at a dotted line shown in the figure.

Fifth Embodiment

<FIG. 15>

FIG. 15 illustrates a process in accordance with a fifth embodiment of the present invention which is similar to the first embodiment except that dummy projections 19 are formed integrally with the upper substrate 10 in order to give generally uniform etching depth in forming the components 30 and 40. The dummy projections 19 are positioned at portions where the components are spaced by a greater width so as to leave a generally uniform width between the adjacent ones of the components 30 and 40 and the dummy projections 19. As shown in FIGS. 15A and 15B, the upper substrate 10 is etched with a mask 52 on its top to form the dummy projections 19 in addition to the components 30 and 40 in the top layer 12 above the buried oxide layer 16, followed by being removed of the mask 52. The dummy projections 19 are selected to have a width smaller than any one of the components and are supported on the buried oxide layer 16 together with the components 30 and 40. Then, the upper substrate 10 is subject to the wet-etching to remove portions of the oxide layer 16 anchoring the dummy projections 19, thereby releasing them from the upper substrate 10, as shown in FIG. 15C. The etching proceeds firstly to remove the portions of the oxide layer 16 corresponding to the bottoms of the cavities 15 between the adjacent ones of the components and the dummy projections, and then proceeds laterally to remove the portions of the oxide layer 16 to such an extent as to completely remove the portions below the dummy projections 19. Since the components have a width greater than that of the dummy projections 19, the corresponding portions of the oxide layer 16 supporting the components are left adhered to the bottom layer 14 of the upper substrate 10, although they are etched to some extent. Thus, the components 30 and 40 are kept anchored to the bottom layer 14 of the upper substrate 10. Thereafter, the upper substrate 10 is placed on the lower substrate 20 upside down and bonded thereto, shown in FIG. 15D, and is subjected to the etching for removing the bottom layer 14 as well as the oxide layer 16 for releasing the components 30 and 40 from the bottom layer, as shown in FIG. 15E.

Sixth Embodiment

<FIG. 16>

FIG. 16 illustrates a process in accordance with the sixth embodiment of the present invention which is basically similar to the first and second embodiments but is further contemplated to electrically isolate at least one of the components into two mechanically integrated zones in match with a need for applying different electric potentials to the two integrated zones. The electrical isolation is achieved by embedding a dielectric material into a portion or portions of the upper substrate 10 which are finally formed into the components to be divided into the two mechanically integrated zones. The dielectric material is made by oxidization of the upper substrate, i.e., silicon dioxide ($SiO_2$) integrally formed in the top surface of the upper substrate 10, as explained below in details.

Figure 16A:
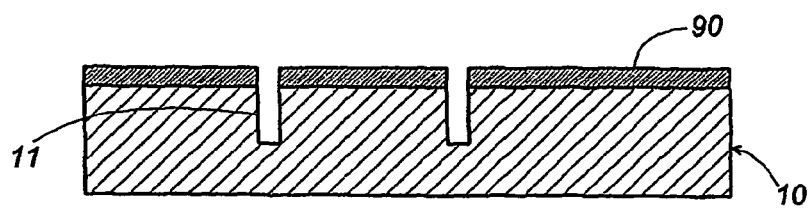
FIGS. 16A to 16H are sectional views illustrating in sequence the steps of a process in accordance with a sixth embodiment of the present invention.
Figure 16B:
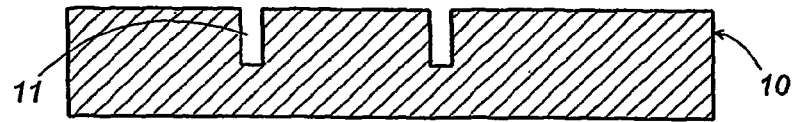
Figure 16C:
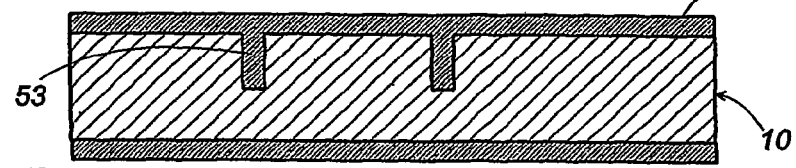
Figure 16D:
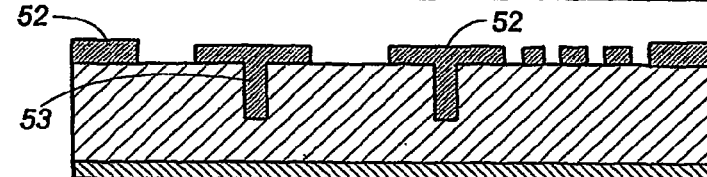
Figure 16E:
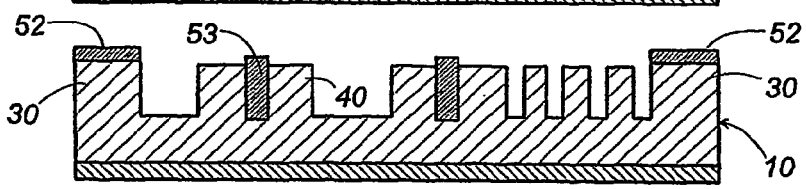
Figure 16F:
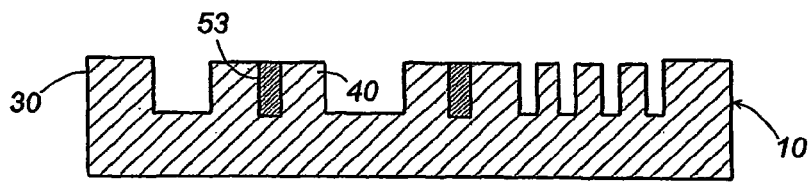
Figure 16G:
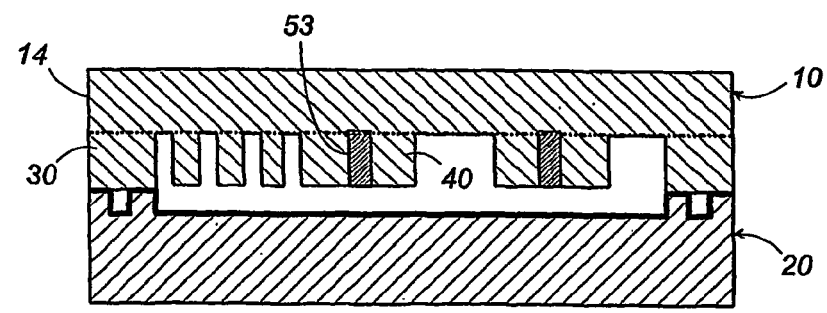
Figure 16H:
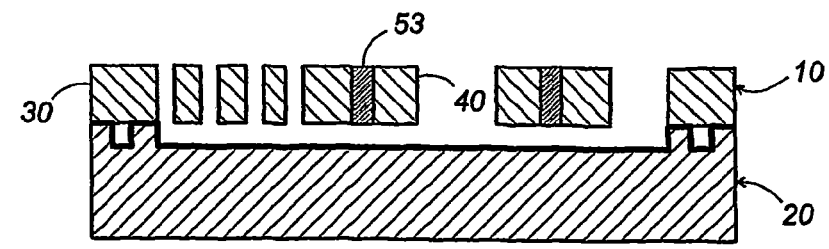

Firstly, the upper substrate 10 is covered with a mask 90 of the oxide layer developed by thermal oxidization or by the CVD treatment made to the top of the upper substrate, and is then etched in its top layer by the deep reactive ion etching (DRIE) to form therein caves 11, as shown in FIG. 16A. Then, mask 90 is removed by use of the hydrofluoric acid solution, as shown in FIG. 16B, after which the upper substrate 10 is thermally oxidized to form on its top a fresh oxide layer 50 of silicon dioxide ($SiO_2$) which also fills the caves 11 to define the dielectric members 53 embedded in the top layer of the upper substrate 10, as shown in FIG. 16C. Subsequently, the oxide layer 50 is selectively etched to leave a mask 52 on top of the substrate 10, as shown in FIG. 16D. The etching is made such that the resulting mask 52 has a thickness greater at portions later formed into the fixed components 30 than at portions later formed into the movable components 40. Then, the upper substrate 10 is treated with the deep reactive ion etching (DRIE) to form the fixed and movable components 30 and 40, during which the mask 52 is etched to such an extent as to be left only on the fixed components 30 but cleared from the top of the movable components 40, as shown in FIG. 16E. Subsequently, the mask 52 remaining on top of the upper substrate 10 is removed by exposure to the hydrofluoric acid solution, leaving the dielectric members 53 kept embedded within the respective caves 11, as shown in FIG. 16F. Thereafter, in the like manner as is made in the previous embodiment, the upper substrate 10 is placed on the lower substrate 20 upside down and bonded thereto (FIG. 16G), after which the bottom layer 14 is etched away to release components 30 and 40 to give the structure of FIG. 16H.

The oxide layer 50 forming the dielectric members 53 may be developed by any other treatment other than the above thermal oxidation, for example, by the CVD, the SOG (Spin On Glass) method, pyro-oxidation, or TEOS (Tetraethoxysilan, Tetraethylorthosilicate) deposition. Although the lower substrate is made of the semiconductor material in the above embodiments, it may be made of a glass or the like dielectric material.

The invention claimed is:

1. A process for fabricating a micro-electro-mechanical system composed of fixed components fixedly supported on a base and movable components movably supported on said base; said process comprising the steps of:
1) providing a upper semiconductor substrate (10) and a lower substrate (20) which defines said base;
2) selectively etching a top layer (12) in said upper semiconductor substrate to form therein a plurality of posts which project commonly from a bottom layer (14) of said upper semiconductor substrate, said posts including said fixed components (30) to be fixed to said lower substrate and said movable components (40) which are resiliently coupled to one or more of said fixed components to be movable relative to said lower substrate;
3) selectively etching a top surface of said lower substrate to form therein at least one recess (22);
4) bonding said upper semiconductor substrate on top of said lower substrate with said upper semiconductor substrate upside down in such a manner as to place said fixed components directly on said lower substrate and to place said movable components upwardly of said at least one recess; and
5) removing said bottom layer from said upper semiconductor substrate to release said movable components from said bottom layer for floating said movable components above said at least one recess and allowing them to move relative to said lower substrate, while keeping said fixed components fixed to the top of said lower substrate.

2. The process as set forth in claim 1, wherein said bottom layer (14) of said upper semiconductor (10) substrate is removed firstly by abrasion and subsequently by etching.

3. The process as set forth in claim 1, wherein said upper semiconductor substrate is of a SOI (silicon on insulator) structure having a buried oxide layer (16) extending between said top layer (12) and said bottom layer (14), said upper semiconductor substrate being etched to form said fixed and movable components (30, 40) that are be supported on said bottom layer through said buried oxide layer, said bottom layer (14) and said buried oxide layer (16) being removed after said upper semiconductor substrate (10) is bonded to said lower substrate (20).

4. The process as set forth in claim 3, wherein said bottom layer (14) is removed at least partially by abrasion, while said buried oxide layer is removed by etching.

5. The process as set forth in claim 3, wherein said bottom layer (14) is removed partially by abrasion followed by being etched to the buried oxide layer, and said buried oxide layer (16) is dry-etched by a method different from that for etching said bottom layer.

6. The process as set forth in claim 3, wherein said buried oxide layer (16) is removed by a dry-etching.

7. The process as set forth in claim 3, wherein all of said fixed and movable components have uniform height standing from said buried oxide layer.

8. The process as set forth in claim 3, wherein said fixed and movable components (30, 40) projecting on said buried oxide layer (16) are covered with an oxidized coat (18), said oxidized coat (18) having a thickness less than said buried oxide layer (16) and being etched away in order to smoothen the faces of said fixed and movable components (30, 40) prior to said upper semiconductor substrate (10) being bonded to said lower substrate (20).

9. The process as set forth in claim 1, wherein at least one of said upper semiconductor substrate (10) and said lower substrate (20) is formed at the interface therebetween with a groove (26) which extends to the exterior of said system from within an interior space confined between said upper semiconductor substrate (10) and said lower substrate (20) for making said interior space open to the exterior of the system.

10. The process as set forth in claim 1, wherein
said movable components (40) are formed in said top layer (12) of the upper semiconductor substrate to have a height shorter than said fixed components (30).

11. The process as set forth in claim 10, wherein
said upper semiconductor substrate (10) is covered with a composite mask composed of a first mask (52) covering a portion later formed into said fixed component (30) and a second mask (54) covering a portion later formed into said movable component (40) and also said first mask (52),
said composite mask being etched together with the top layer (12) of said upper semiconductor substrate (10) to such an extent as to reduce the height of the movable component (40) relative to that of the fixed component (30).

12. The process as set forth in claim 11, wherein
said first mask (52) is made from a material which is etched at a low etching rate than said second mask (54).

13. The process as set forth in claim 1, wherein
said upper semiconductor substrate (10) is processed to smoothen the side faces of said posts, prior to being bonded to said lower substrate (20).

14. The process as set forth in claim 1, wherein
said lower substrate (20) is covered on its top with a dielectric layer (24).

15. The process as set forth in claim 14, wherein
said lower substrate is made of a semiconductor material and is formed on its top surface with an oxide layer which defines said dielectric layer.

16. The process as set forth in claim 1, wherein
said lower substrate is made of a dielectric material.

17. The process as set forth in claim 1, wherein
said upper semiconductor substrate (10) is processed to cover said fixed and movable components (30, 40) with an etching-shield (74) prior to being bonded said lower substrate such that said components are protected from being etched away during the removal of said bottom layer from said upper semiconductor substrate.

18. The process as set forth in claim 17, wherein
said etching shield (74) is firstly formed on the entire exposed faces of said components (30,40) and removed after said components (30, 40) are released from said bottom layer (14).

19. The process as set forth in claim 1, wherein
said upper semiconductor substrate (10) is of a SOI (silicon on insulator) structure having a buried oxide layer (16) extending between said top layer (12) and said bottom layer (14),
said upper semiconductor substrate (10) being etched to form in its top layer (12) dummy projections (19) between said components,
said dummy projections (19) having a width smaller than said components (30, 40) and being anchored to said buried oxide layer (16),
said buried oxide layer (16) confined between said dummy projections (19) and said bottom layer (14) being etched away to release said dummy projections, prior to said upper semiconductor substrate being bonded to said lower substrate.

20. The process as set forth in claim 1, wherein
said upper semiconductor substrate (10) is etched in its top layer (12) to form a plurality of said posts (30, 40) which leave cavities (15) in said top layer between the adjacent ones of said posts, said cavities having different depths,
said upper semiconductor substrate is etched in its bottom to form a plurality of shelves (17) which project on the bottom of said upper semiconductor substrate in registration with deep ones of said cavities (15), said shelves (17) having a thickness which is proportion to the depth of the associated cavities,
said bottom layer (14) is etched away together with said shelves (17), after said upper semiconductor substrate is bonded to said lower substrate, to release said movable components and fixed components from said bottom layer.

21. The process as set forth in claim 1, wherein
said upper semiconductor substrate (10) is etched in its top layer to form a plurality of said posts (30, 40) to leave cavities (15) in said top layer between the adjacent ones of said posts, said cavities having different depths,
said upper semiconductor substrate is covered on its bottom with masks (17A) which cover areas in registration with said cavities, said masks having a thickness which is proportion to the depth of the associated cavities,
said top layer is etched away together with said mask, after said upper semiconductor substrate is bonded to said lower substrate, to release said movable components and said fixed components from said bottom layer.

22. The process as set forth in claim 1, wherein
said upper semiconductor substrate (10) is embedded with a dielectric member (53) which penetrates through the top layer (12), said dielectric member (53) being confined within a portion to be later formed into said post (30, 40) in order to electrically divide the associated component into two zones for electrical insulation therebetween and to keep said zones mechanically integrated with each other, said upper semiconductor substrate is etched in its top layer to form said post with said dielectric member kept embedded in said post which is finally formed into one of said movable and fixed components (30, 40) by removal of said bottom layer (14) from said upper semiconductor substrate (10).

23. A micro-electro-mechanical system comprising:
a lower substrate (20);
an upper substrate (10) bonded on to said lower substrate, said upper substrate being composed of fixed components (30) fixed to said lower substrate, and movable components (40) that are resiliently coupled to one or more of said fixed components to be movable within a plane of said upper substrate relative to said lower base,
said movable components (40) being adapted to receive an electric potential relative to said fixed components for developing an electrostatically attracting force by which said movable components are driven to move;
said lower substrate (20) being formed in its top surface with at least one recess (22) above which said movable components are located,
wherein at least one groove is formed at the interface between said lower substrate and said upper substrate to extend to the exterior of said system from within an interior space confined between said lower substrate and said upper substrate for making said interior space open to the exterior of the system.

\* \* \* \* \*

UNITED STATES PATENT AND TRADEMARK OFFICE
CERTIFICATE OF CORRECTION

PATENT NO.       : 7,422,928 B2                                    Page 1 of 1
APPLICATION NO.  : 10/572554
DATED            : September 9, 2008
INVENTOR(S)      : Naomasa Oka et al.

It is certified that error appears in the above-identified patent and that said Letters Patent is hereby corrected as shown below:

On the Title Page

Item "(22)" should read: PCT Filed: Sep. 21, 2004

Signed and Sealed this

Sixteenth Day of December, 2008

JON W. DUDAS
*Director of the United States Patent and Trademark Office*